US009460814B2

(12) United States Patent
Dragula et al.

(10) Patent No.: US 9,460,814 B2
(45) Date of Patent: Oct. 4, 2016

(54) MEMORY TESTER DESIGN FOR SOFT ERROR RATE (SER) FAILURE ANALYSIS

(71) Applicant: International Business Machines Corporation, Armonk, NY (US)

(72) Inventors: Joshua M. Dragula, Pleasant Valley, NY (US); Charles J. Montrose, Clintondale, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 127 days.

(21) Appl. No.: 14/268,277

(22) Filed: May 2, 2014

(65) Prior Publication Data
US 2015/0318059 A1    Nov. 5, 2015

(51) Int. Cl.
    *G11C 29/38*   (2006.01)
    *G11C 29/44*   (2006.01)
    *G11C 29/56*   (2006.01)
    *G11C 29/52*   (2006.01)

(52) U.S. Cl.
    CPC ......... *G11C 29/56008* (2013.01); *G11C 29/38* (2013.01); *G11C 29/44* (2013.01); *G11C 29/52* (2013.01)

(58) Field of Classification Search
    CPC .............. G11C 11/401; G11C 29/44; G11C 2029/0409; G06F 11/106; G06F 11/141
    See application file for complete search history.

(56) References Cited

U.S. PATENT DOCUMENTS

| 4,438,494 A | 3/1984 | Budde et al. |
| 5,081,575 A | 1/1992 | Hiller et al. |
| 5,173,906 A * | 12/1992 | Dreibelbis ............... G06F 11/27 714/733 |
| 5,376,849 A | 12/1994 | Dickol et al. |
| 5,389,830 A | 2/1995 | Buckingham et al. |
| 5,680,537 A * | 10/1997 | Byers .................. G06F 11/2268 714/5.11 |
| 6,208,667 B1 | 3/2001 | Caldara et al. |
| 7,213,186 B2 | 5/2007 | Chien |
| 7,865,805 B1 | 1/2011 | Gallagher et al. |
| 8,089,959 B2 | 1/2012 | Szymanski |
| 2005/0077941 A1 | 4/2005 | Fagan et al. |
| 2007/0226600 A1* | 9/2007 | Ogawa ................ G06F 11/1008 714/798 |

(Continued)

OTHER PUBLICATIONS

"Multiple-bit upset (MBU)." JEDEC: Global Standards for the Microelectronics Industry. https://www.jedec.org/standards-documents/dictionary/terms/multiple-bit-upset-mbu., published Oct. 2006, accessed on Mar. 29, 2016. 2 pages.*

*Primary Examiner* — Albert Decady
*Assistant Examiner* — Kyle Vallecillo
(74) *Attorney, Agent, or Firm* — Yuanmin Cai; Andrew M. Calderon; Roberts Mlotkowski Safran Cole & Calderon, P.C.

(57) ABSTRACT

A method of determining multi-bit upsets (MBU) during soft error rate (SER) testing of a memory device under test is provided. The method may include receiving an error indication based on a comparison between a generated test data pattern written to an address location on the memory device and a stored version of the generated test data pattern read from the address location on the memory device. The error indication is associated with error information associated with the comparison between the generated test data and the stored version of the generated test data. Based on the received error indication, a count value associated with one of a predetermined number of passes a plurality of generated test data patterns traverse between a first and a second memory address location on the memory device is determined. The MBU is determined based on the address location, the error information, and the count value.

18 Claims, 11 Drawing Sheets

(56) References Cited

U.S. PATENT DOCUMENTS

| | | |
|---|---|---|
| 2008/0212382 A1 | 9/2008 | Mouttet |
| 2009/0158111 A1* | 6/2009 | Johnson .............. H03M 13/05 714/750 |
| 2009/0284296 A1 | 11/2009 | Fagan et al. |
| 2010/0185897 A1* | 7/2010 | Abts .................. G06F 11/106 714/16 |
| 2012/0159269 A1 | 6/2012 | Ibe et al. |

* cited by examiner

MEMORY TESTER DESIGN FOR SOFT ERROR RATE (SER) FAILURE ANALYSIS

BACKGROUND

The present invention generally relates to memory devices, and more particularly, memory device testing.

In the area of memory failure analysis, memory devices may be susceptible to a phenomenon known as soft errors, where radioactive particles may cause memory cells to logically flip (i.e., change logic state). A soft error rate (SER) tester may, accordingly, be utilized to detect such soft errors in a laboratory-controlled radioactive environment in order to analyze the memories' soft error rate (SER).

In the area of SER failure analysis, testers have traditionally been designed to detect when a radioactive particle causes a single memory cell to logically flip. This single memory cell logic state change may be known as a single-bit upset (SBU). However, as the physical separation between adjacent memory cells continues to decrease with the scaling of modern devices, a new error is beginning to occur, whereby a radioactive particle may causes several local memory cells to logically flip. This multiple memory cell logic state change may be known as a multi-bit upset (MBU). The detection of MBU's may pose challenges for the present generation of SER testers since error detection occurs at low PC speeds while the tester cycles through the memory device under test (DUT) at relatively higher generator speeds.

SUMMARY

According to one embodiment, a logical-to-physical mapping of soft error (SE) fail locations (i.e., memory address locations) on a memory array under test (i.e., a DUT: Device Under Test), along with a temporal correlation associated with the mapped failures, may provide for a separate determination of SBU's and MBU's.

According to at least one exemplary embodiment, a method of determining a multi-bit upset (MBU) during soft error rate (SER) testing of a memory device under test is provided. The method may include receiving an error indication based on a comparison between a generated test data pattern written to an address location on the memory device and a stored version of the generated test data pattern read from the address location on the memory device. The error indication is associated with error information corresponding to the comparison between the generated test data pattern and the stored version of the generated test data pattern. The method may further include determining by a processor, based on the received error indication, a count value associated with one of a predetermined number of passes that a plurality of generated test data patterns traverse between a first and a second memory address location on the memory device. The MBU may then be determined based on the address location, the error information, and the determined count value.

According to another exemplary embodiment, a computer system for determining a multi-bit upset (MBU) during soft error rate (SER) testing of a memory device under test is provided. The computer system may include one or more processors, one or more computer-readable memories, one or more computer-readable tangible storage mediums, and program instructions stored on at least one of the one or more storage mediums for execution by at least one of the one or more processors via at least one of the one or more memories. The computer system is capable of performing a method that may include receiving an error indication based on a comparison between a generated test data pattern written to an address location on the memory device and a stored version of the generated test data pattern read from the address location on the memory device. The error indication is associated with error information corresponding to the comparison between the generated test data pattern and the stored version of the generated test data pattern. The performed method may further include determining, based on the received error indication, a count value associated with one of a predetermined number of passes that a plurality of generated test data patterns traverse between a first and a second memory address location on the memory device. The MBU may then be determined based on the address location, the error information, and the determined count value.

According to yet another exemplary embodiment, a computer program product for determining a multi-bit upset (MBU) during soft error rate (SER) testing of a memory device under test may include one or more tangible computer-readable storage mediums and program instructions stored on at least one of the one or more tangible storage mediums such that the program instructions are executable by a processor. The program instructions may include receiving an error indication based on a comparison between a generated test data pattern written to an address location on the memory device and a stored version of the generated test data pattern read from the address location on the memory device. The error indication associated with error information corresponding to the comparison between the generated test data pattern and the stored version of the generated test data pattern. The performed method may further include determining, based on the received error indication, a count value associated with one of a predetermined number of passes that a plurality of generated test data patterns traverse between a first and a second memory address location on the memory device. The MBU may then be determined based on the address location, the error information, and the determined count value.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
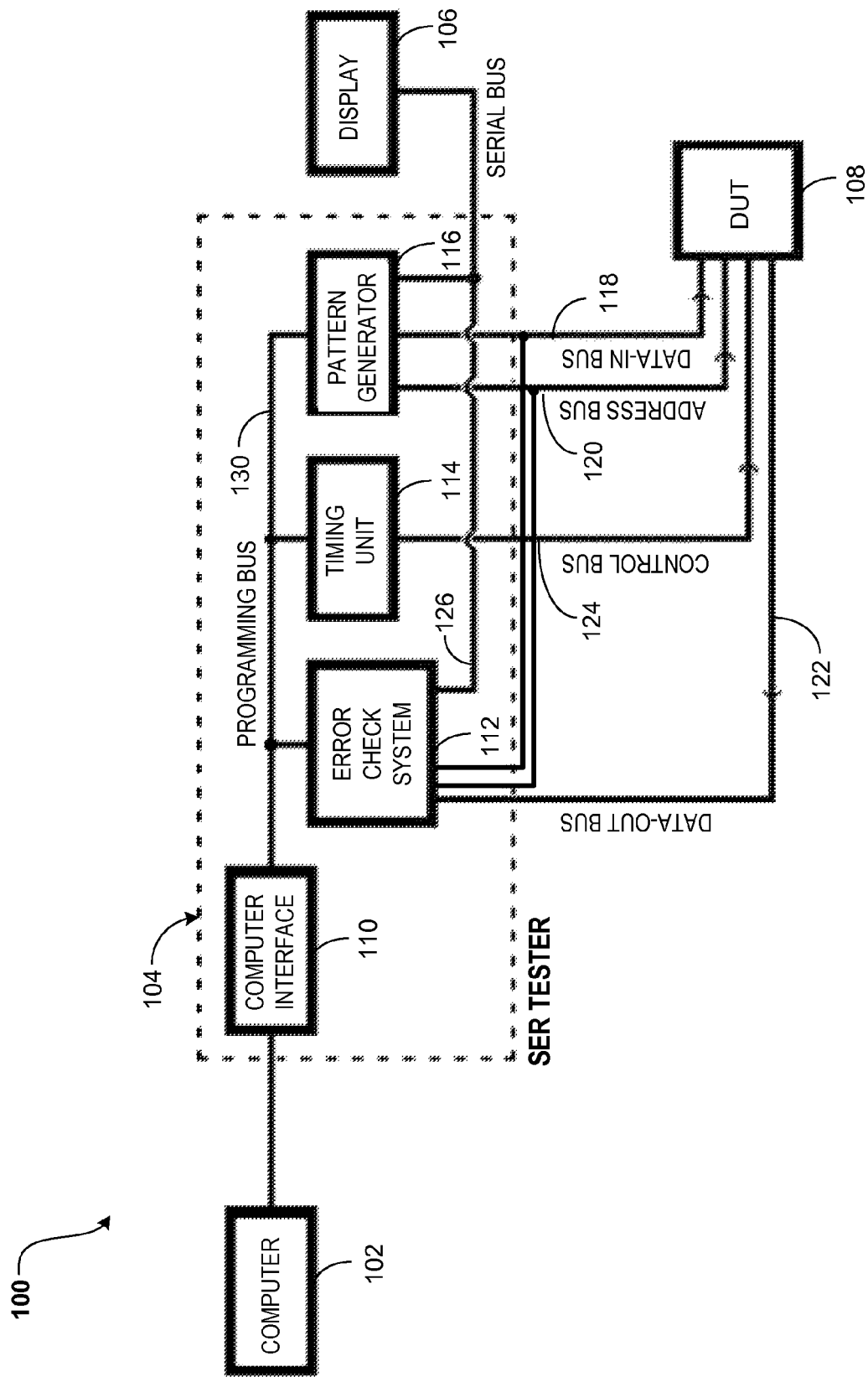
FIG. 1 depicts a block diagram of the subsystems of an SER test environment according to one embodiment.

According to the one or more exemplary embodiments described herein, an error check system associated with SER tester may provide for the determination of MBUs for each DUT. More specifically, the described embodiments, among other things, enable the SER tester to capture soft errors (SEs) having temporal (i.e., time-based) information at higher operational speeds, while simultaneously allowing a computer or other processing device to access the captured SEs for analysis (e.g., logical-to-physical mapping of fail locations and MBU determinations) at a lower operational frequency relative to the SER tester.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable cable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 depicts a block diagram of the subsystems of an SER test environment 100 according to one exemplary embodiment. As illustrated, the SER test environment 100 may include a computer or processing device 102, an SER tester 104, a display 106, and a device under test (DUT) 108, which may typically include a memory device. The SER tester 104 may include a computer interface 110, an error check system 112, a timing unit 114, and a pattern generator 116.

The computer or processing system 102 may, for example, control the operation of the SER tester 104, as well as capturing or reading the soft error (SE) information generated by the SER tester 104. The capturing and/or control operations of the computer 102 may be carried via a computer interface 110 within the SER tester 104. For example, the computer interface 110 may include a buffer memory for storing the SE information. The buffered SE information may then be accessed and analyzed by the computer 102. For example, in some implementations, the computer 102 may also control the operation of the SER tester 104 by sending memory address information to the pattern generator 116 within the SER tester 104. The memory address information may define the memory region within the DUT 108 (i.e., memory device) that receives test patterns. For example, the memory address information may include a word_max_address, a word_min_address, a bit_max_address, and a bit_min_address. Using the memory address information, either the entire memory array or any particular region of the memory array of the DUT 108 may be tested.

In operation, under the control of the timing unit 114 and the pattern generator 116, the DUT 108 receives a test data pattern. More specifically, the pattern generator 116 generates the test data pattern that is received by the DUT 108 via data-in bus 118. The address location on the DUT 108 to which the test data pattern is written is also generated by the pattern generator 116 and received by the DUT via address bus 120. Once the test data pattern is written to DUT 108 under the control of the timing unit 114, the test data pattern is subsequently read from the DUT 108. The read test data pattern is then sent to the error check system 112 via the data-out bus 122 in order to determine the occurrence of SEs. The read/write control information may be generated by the timing unit 114 and sent to the DUT 108 via control bus 124.

At the error check system 112, the test data pattern read from the DUT 108 via the data-out bus 122 is compared with the test data pattern generated by the pattern generator 116. The test data pattern generated by the pattern generator 116 may be sent to the error check system 112 via bus 118, while as previously indicated, the test data pattern read from the DUT 108 is received by the error check system 112 via the data-out bus 122. The generated test data pattern (e.g., $B_0$-$B_{15}$) and the read test data pattern (e.g., $B'_0$-$B'_{15}$) are then compared for errors (i.e., SEs) at the error check system 112. For example, a comparator device that includes a plurality of EXOR gates (e.g., 16 EXOR gates) may be used to detect bit-errors. Each bit (e.g., $B_0$) of the generated test data pattern may, therefore, be compared to each corresponding bit (e.g., $B'_0$) of the read test data pattern using an EXOR gate (EXOR gate_0). If the output of the EXOR gates are all a logic 0, then no error has occurred. Conversely, if the output of any one of the EXOR gates (EXOR gate_0=1) is at a logic 1, then an error has occurred at that bit position (e.g., bit position 0).

In memory testing, the status of the test environment 100 may be monitored. Due to the dangerous levels of radiation used in SER testing as a result of utilizing proton beams to invoke SEs, the computer 102 controlling the SER tester 104 may be kept outside the testing area. For example, over a hundred feet of cable may, therefore, be required to establish communication between computer 102 and the SER tester 104. The display 106 thus allows an operator to visually verify that the SER tester 104 and computer 102 readout match.

Figure 2:
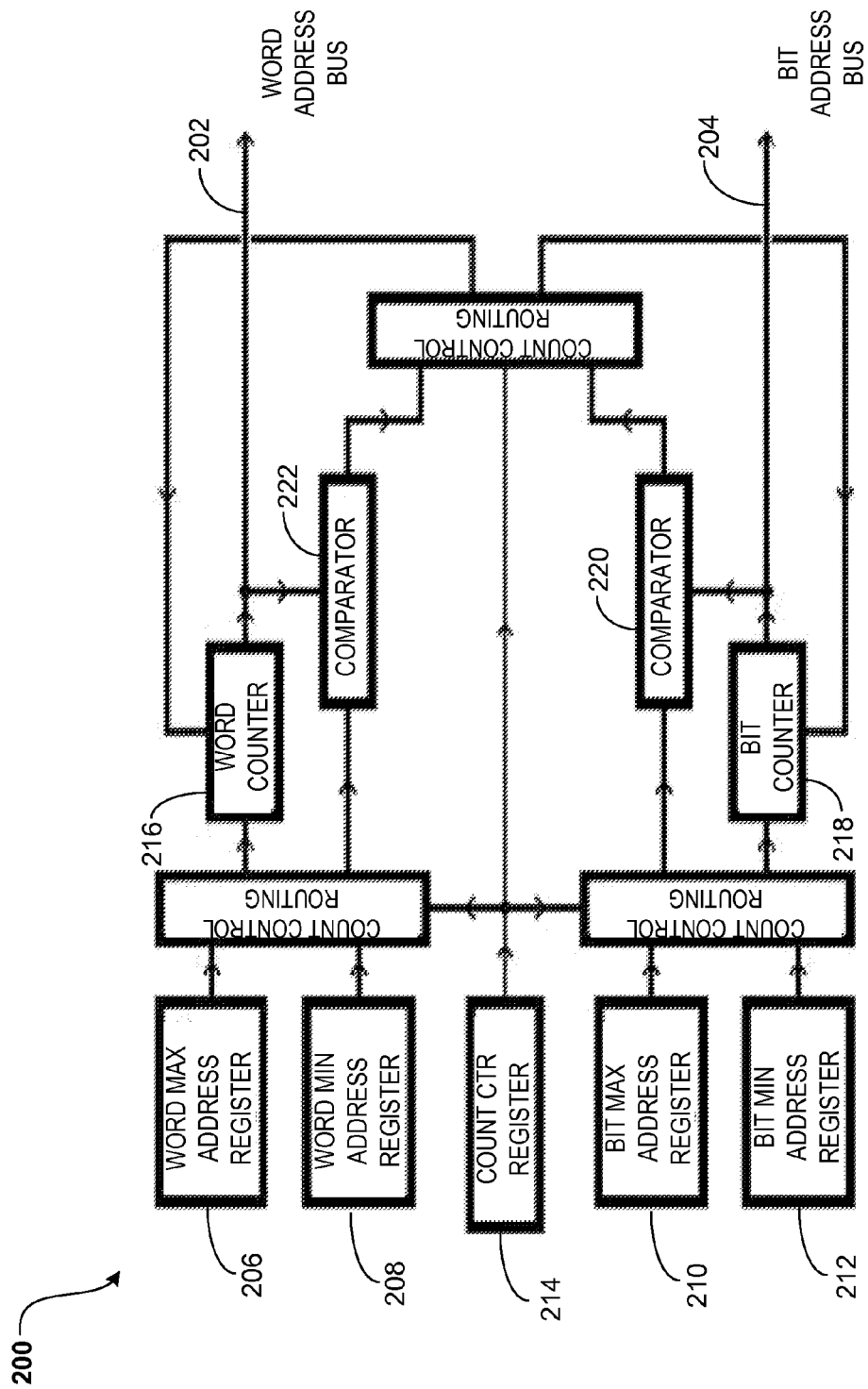
FIG. 2 depicts a block diagram of an exemplary embodiment of an address bus generator associated with the SER test environment of FIG. 1 according to one embodiment.

FIG. 2 depicts a block diagram of an exemplary embodiment of an address bus generator 200 located within pattern generator 116 (FIG. 1). The address bus generator 200 may generate a word address and a bit address for respective transmission on word address bus 202 and bit address bus 204. As illustrated, the address bus generator 200 may include a word_max_address register 206, a word_min_address register 208, a bit_max_address register 210, and a bit_min_address register 212. The word_max_address, word_min_address, bit_max_address, and bit_min_address values stored within the word_max_address register 206, word_min_address register 208, bit_max_address register 210, and bit_min_address register 212, respectively, provide user-defined minimum and maximum address values for sweeping or traversing a predefined region of the memory array. The user-defined minimum and maximum address values may therefore enable read/write operations to either the entire memory or any select region of the memory array.

The address bus generator 200 may further include a count control register 214, a 16-bit programmable word counter 216, a 16-bit programmable bit counter 218, a bit counter comparator 220, and a word counter comparator 222. The count control register 214 may enable different memory access sequences such as, for example, ripple word or ripple bit. In ripple word, the address sweep sequence through the memory array goes through all the designated word rows (e.g., 64 k) within a bit column (e.g., $B_0$) before moving to the next bit column (e.g., $B_1$). Alternatively, in ripple bit mode, the address sweep sequence through the memory array of the DUT 108 (FIG. 1) goes through all the designated bits (e.g., $B_0$-$B_{15}$) within a word row (e.g., $WD_0$) before moving to the next address row (e.g., $WD_1$).

The word address on word address bus 202 is generated by the value within the 16-bit programmable word counter 216. For example, according to one implementation, each time the word counter 216 is incremented, its value may be compared with the word_max_address value within the word_max_address register 206. Thus, when the word counter 216 reaches a value that is same as the value within the word_max_address register 206, the comparator 222 may generate a signal resetting the word counter 216.

Based on the comparator 222 signaling the reset, the bit counter 218 may then start to increment. Each time the bit counter 218 is incremented, its value may be compared with the bit_max_address value within the bit_max_address register 210. Thus, when the bit counter 218 reaches a value that is same as the value within the bit_max_address register 210, the comparator 220 may generate a signal resetting the bit counter 218. Based on the comparator 220 signaling the reset, the word counter 216 may now start to increment. It may be appreciated that the count sequence associated with the word and bit counters 216, 218 may be implemented according to different configurations. For example, the bit counter 216 may start incrementing first, whereby upon reaching a maximum predefined address value, the word counter 218 then starts to increment. Also, the counters may operate in decrementing mode, whereby the values in the word and bit counters 216, 218 go through a count-down sequence. In such an implementation, the bit_min_address value and the word_min_address value in registers 208 and 212, respectively, may be used in conjunction with the comparators 220, 222.

As previously described, the address bus generator 200 may generate a word address and a bit address for respective transmission on word address bus 202 and bit address bus 204. Therefore, a sweep of the address locations on the memory array is provided, whereby at each accessed memory location, a data pattern may be stored (i.e., write operation) or retrieved (i.e., a read operation).

Figure 3:
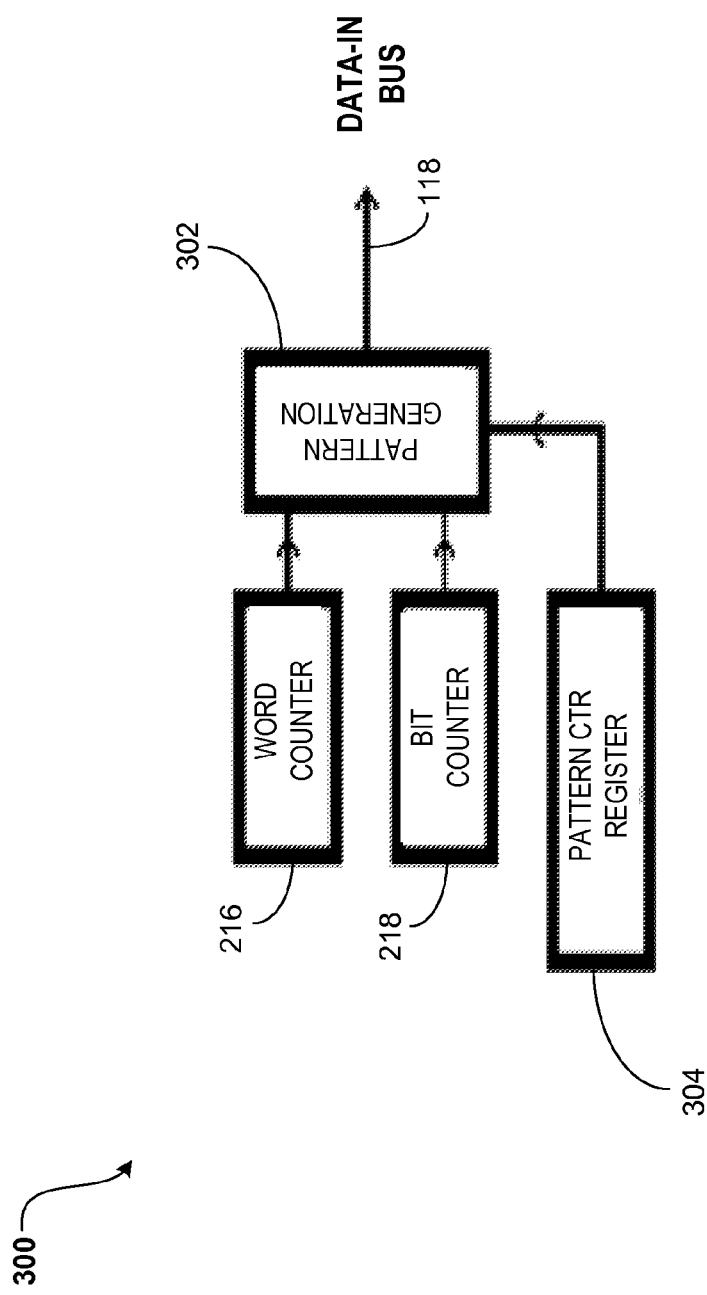
FIG. 3 depicts a block diagram of an exemplary embodiment of a data-in bus generator located within the SER test environment of FIG. 1 according to one embodiment.

FIG. 3 depicts a block diagram of an exemplary embodiment of a data-in bus generator 300 located within pattern generator 116 (FIG. 1). The data-in bus generator 300 may include word counter 216 (FIG. 2), bit counter 218 (FIG. 2), a pattern generator 302, and a pattern control register 304. As shown, the word counter 216 and the bit counter 218 may be the same as that depicted in FIG. 2. Alternatively, the word counter 216 and the bit counter 218 may be a replica of that depicted in FIG. 2. The word counter 216 and the bit counter 218 values may be input to the pattern generator 302 in order to generate different test data patterns (i.e., data-in), which are output onto data-in bus 118. Thus, the pattern generator 302 may include various combinational logic that generate data from the inputted values received from the word and/or bit counters 216, 218.

The values within the pattern control register 304 may accordingly control different logic blocks that facilitate generating the test data patterns. For example, the values within the pattern control register 304 may determine whether the test pattern generated by the pattern generator 302 is dependent on the word counter 216, the bit counter 218, or based on both the word and the bit counter 216, 218. The pattern control register 304 may also control Read-Only and Write-Only modes, whether every other bit on the data-in bus 118 will be complemented, and/or whether the entire data values generated on the data-in bus 118 will be complemented with each consecutive pass through the addresses of the memory array (i.e., DUT) 108 (FIG. 1). The pattern control register 304 thus may include control values that determine the pattern of test data generated within the pattern generator 116 (FIG. 1). For example, a checker board pattern of data may be generated and read into the memory array (i.e., DUT 108). It may be appreciated that a myriad of other patterns may be generated by using different values within the pattern control register 304.

Figure 4:
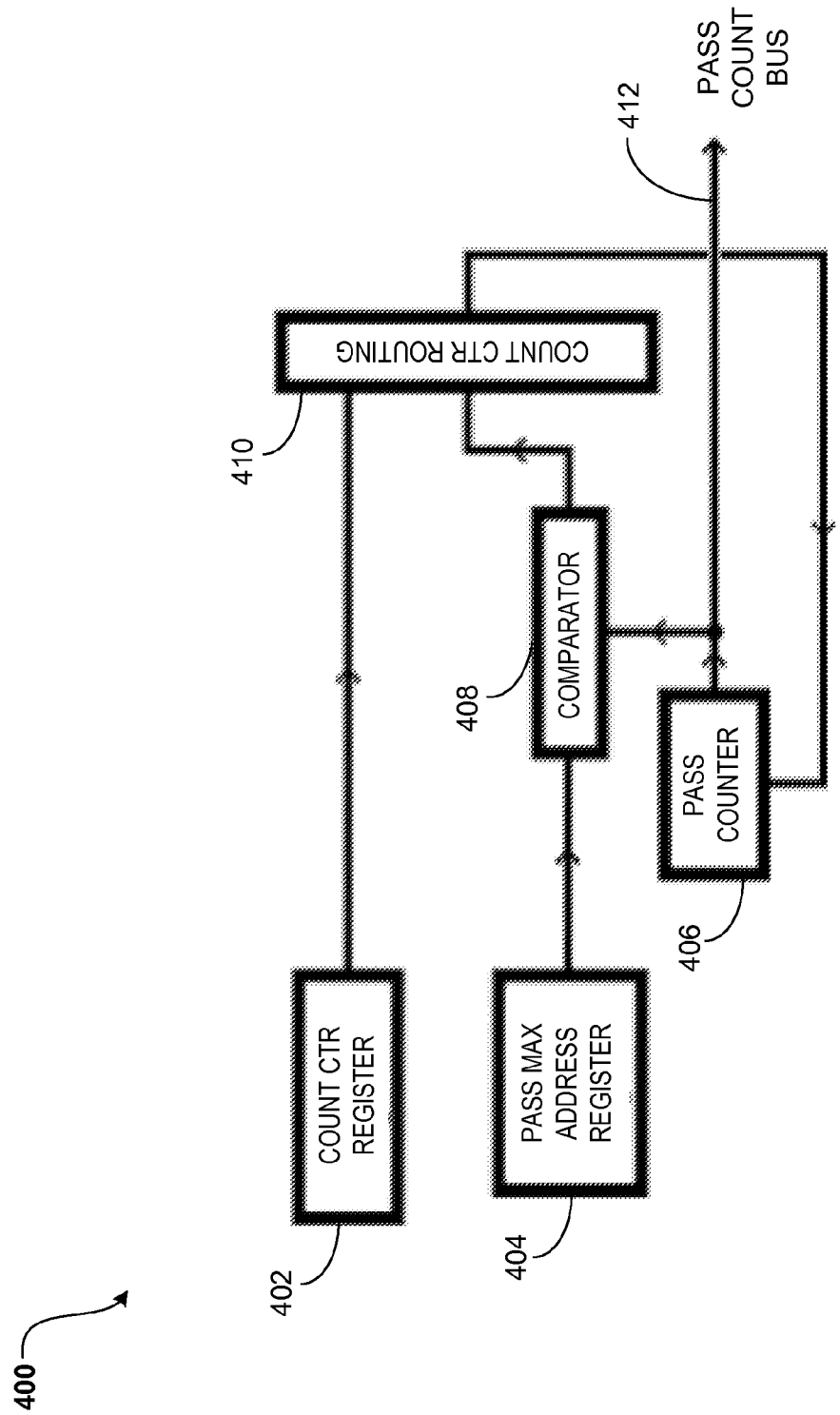
FIG. 4 depicts a block diagram of an exemplary embodiment of a pass count generator located within the SER test environment of FIG. 1 according to one embodiment.

FIG. 4 depicts a block diagram of an exemplary embodiment of a pass count generator 400 located within pattern generator 116 (FIG. 1). The pass count generator 400 may count the number of passes the tester 104 (FIG. 1) makes through the DUT's 108 (FIG. 1) predetermined address range. As previously described, the predetermined address range may, for example, be set via the word_max_address register 206 (FIG. 2), a word_min_address register 208 (FIG. 2), a bit_max_address register 210 (FIG. 2), and a bit_min_address register 212 (FIG. 2).

The pass count generator 400 may include a count control register 402, a pass_maximum address register 404, a pass counter (e.g., 8-bit counter) 406, a comparator 408, a count control router 410, and a pass count bus 412 that receives the pass counter 406 values. The count control register 402 may, for example, set the pass counter 406 to increment or decrement. Based on a predetermined maximum value (e.g., 10 passes: 0000 1010) set by the pass_maximum address register 404, the pass counter 406 is incremented on each pass through the DUT's 108 (FIG. 1) predetermined address range. For example, once the pass counter 406 is reset (i.e., 0000 0000), on each pass the pass counter 406 is incremented (e.g., 0000 0001). On each pass, the value in the pass counter 406 is compared to the value set within the pass_maximum address register 404 using the comparator 408. When the value (e.g., 0000 1010) within the pass counter 406 reaches the value (e.g., 0000 1010) set within the pass_maximum address register 404, the comparator may generate a zero output, whereby the pass counter 406 may be reset and an indication may be generated that the tester has completed the test. The pass counter 406 indicates the pass number for when the stored data (written data) is collected (read data) for error detection. Thus, the pass counter 406 acts as a time-stamp for the errors detected. For example, one or more errors may be detected by the error check system 112 (FIG. 1) during pass number '5' (i.e., 0000 0101).

Figure 5:
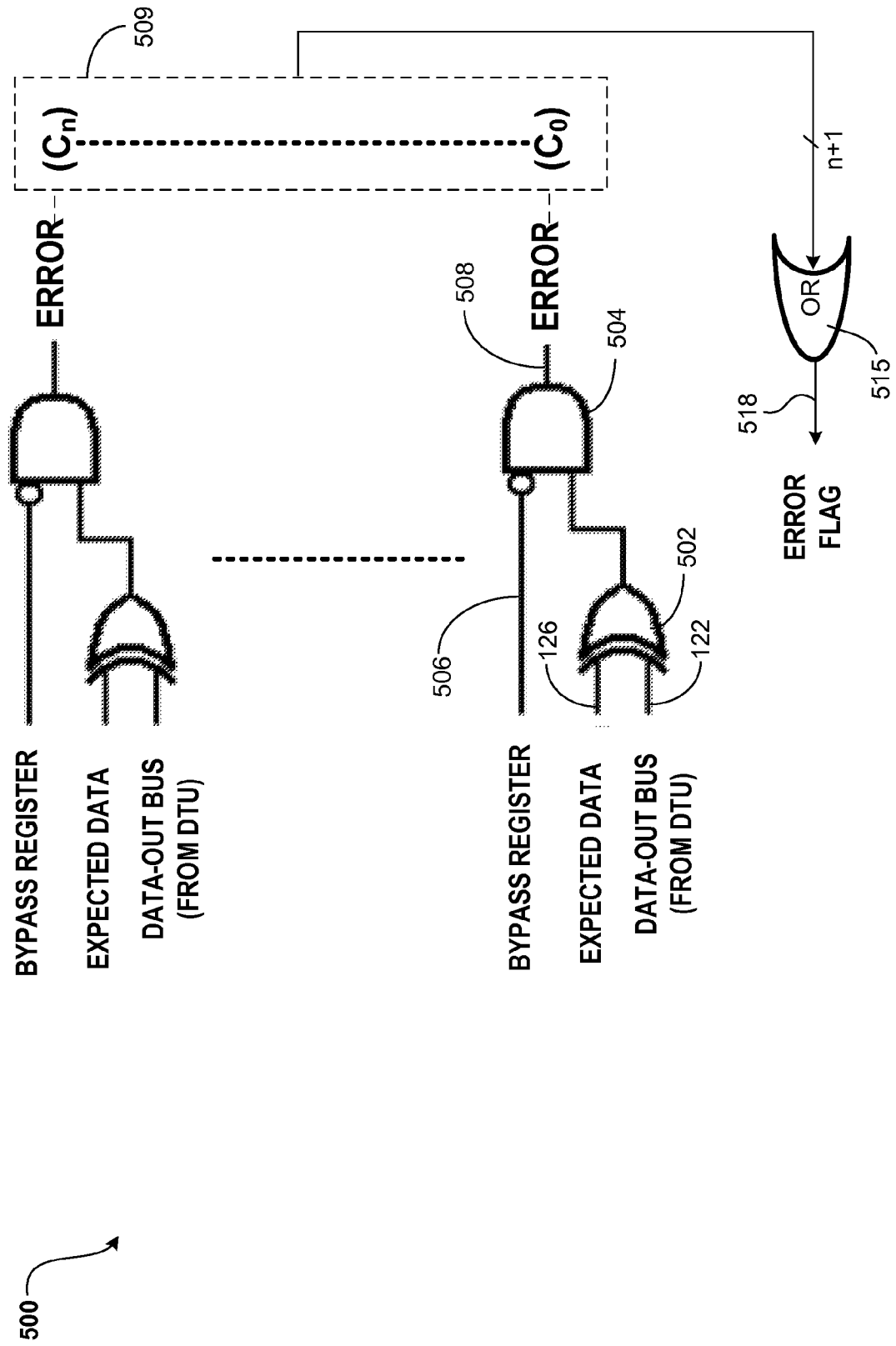
FIG. 5 depicts a block diagram of an exemplary embodiment of an error detection with bypass circuit located within the SER test environment of FIG. 1 according to one embodiment.

FIG. 5 depicts a block diagram of an exemplary embodiment of an error detection with bypass circuit 500 located within error check system 112 (FIG. 1). The error detection with bypass circuit 500 may include, for each data bit, a comparator 502 and a bypass AND gate 504. The error detection with bypass circuit 500 receives both the test pattern data that is read out from the DUT 108 via the data-out bus 122 and the expected test pattern data received from the serial bus 126. The expected test pattern data includes the data that is output from the pattern generator 302 (FIG. 3) and read into the DUT 108 (FIG. 1) via data-in bus 118.

When the bypass register input 506 is set to 'logic 0' the error output 508 will depend on the result of comparator 502. Thus, in this mode, if an error is detected, the expected and read out data will differ, causing the error output 508 to toggle to 'logic 1'. Alternatively, if no error is detected, the expected and read out data will be the same, causing the error output 508 to be at 'logic 0'.

However, when the bypass register input 506 is set to 'logic 1', the error output 508 will be locked to 'logic 0' and is, therefore, independent of the result of comparator 502. This particular mode may be selected when the DUT 108 (FIG. 1) requires fewer channels than the data-out bus 122 offers in order to avoid erroneous errors. For example, the data-out bus 122 may offer bit positions $B_0$-$B_{15}$, while the DUT data being tested may include a data word that takes up bit positions $B_0$-$B_{13}$ of the data-out bus 122. Thus, channels $B_{14}$ and $B_{15}$ are not in use. Here, for bit positions or channels $B_{14}$ and $B_{15}$, the bypass register input is set to 'logic 1', locking the error output 508 at 'logic 0'. The error output 508 of 'logic 0' is indicative of no error and, therefore, any erroneous error determinations are avoided for data-out bus 122 channels (e.g., $B_{14}$-$B_{15}$) that are not in use by the DUT 108 (FIG. 1). As previously indicated, the error detection with bypass circuit 500 may include a comparator 502 and a bypass AND gate 504 for each data bit. Thus, for example, if the data-out bus 122 offers bit positions $B_0$-$B_{15}$, the number of utilized error detection with bypass circuits 500 will be sixteen (16) for each of bit positions $B_0$-$B_{15}$. Thus, as further depicted in FIG. 5, multiple error detection with bypass circuits 500 may be provided based on the word lengths used by the pattern generator. For example, for a 32-bit word, 32 identical error detection with bypass circuits 500 may be used, thus generating thirty two (32) error information bit (i.e., $C_0$-$C_{31}$).

Referring to the timing unit 114 (FIG. 1), in memory testing, unique control signals may be generated for a variety of different memory devices. While some memories may only require a single clock per read/write cycle, others may need two or three clocks. The exact timing and pulse-width of each clock within a cycle may also vary for different devices. A traditional approach to generating such highly-definable control signals may involve utilizing a high-speed clock to run a state machine that could be logically programmed to generate a user-defined control signal for a low-speed device operating cycle. However, since memory testers such as SER testers may often be used for in-field operations, it may be imperative that a tester be compact and efficient, therefore, making it impractical, in certain aspects, to include a high-speed clock generator. Thus, as disclosed herein, a complete bus of control signals utilizing only a single low-speed clock generator may be generated.

Figure 6:
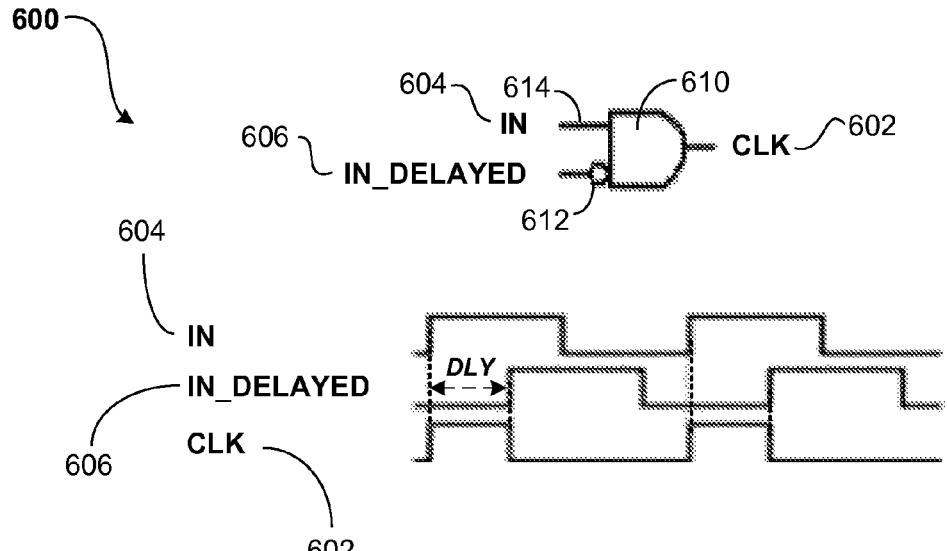
FIG. 6 depicts a block diagram of an exemplary embodiment of a clock pulse generator located within the SER test environment of FIG. 1 according to one embodiment.

Accordingly, FIG. 6 depicts a block diagram of an exemplary embodiment of a clock pulse generator 600 located within timing unit 114 (FIG. 1). As shown, a clock signal (CLK) 602 can be generated by gating the input clock signal (IN) 604 with the complement (i.e., logically inverted) of the time delayed version of the input clock signal (IN_DELAYED) 606. The clock signal (CLK) 602 may therefore be generated by an AND gate 610 having one inverted input 612 and one non-inverted input 614. The input clock signal (IN) 604 is applied to the non-inverted input 614, while the time delayed version of the input clock signal (IN_DELAYED) 606 is applied to the inverted input 612. As depicted by the waveforms, the clock signal (CLK) 602 has the same frequency as the input clock signal (IN) 604. However, the pulse period of the generated clock signal (CLK) 602 varies based on the amount of delay, as indicated by DLY, between the input clock signal (IN) 604 and the time delayed version of the input clock signal (IN_DELAYED).

Figure 7:
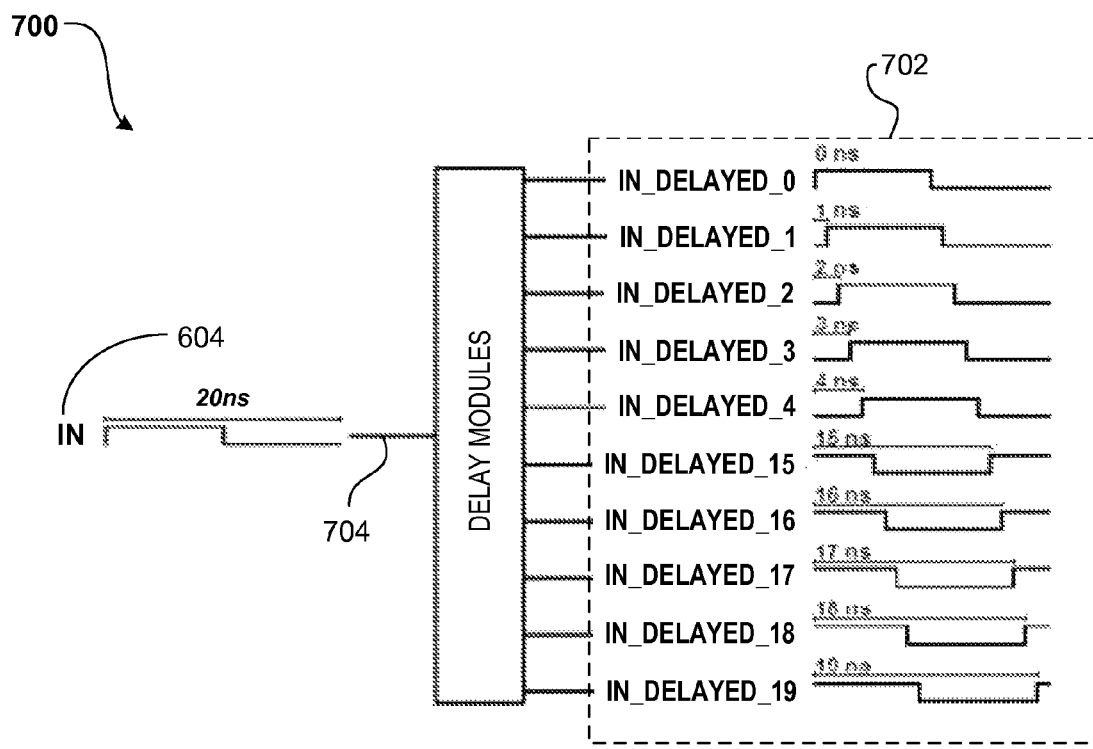
FIG. 7 depicts a block diagram of an exemplary embodiment of a delay module located within the SER test environment of FIG. 1 according to one embodiment.

FIG. 7 depicts a block diagram of an exemplary embodiment of a delay module 700 located within timing unit 114 (FIG. 1). The delay module 700 generates a plurality of delayed input clock signals (IN_DELAYED_N) 702 that may each be applied to input 612 of the clock pulse generator 600 in order to generate clock signals (CLK) 602 (FIG. 6) capable of having different pulse widths. As depicted, IN_DELAYED_0 has no delay compared to the input clock signal (IN) 604 applied to the delay module input 704. IN_DELAYED_1 has a 1 nanosecond (ns) delay compared to IN_DELAYED_0. IN_DELAYED_2 has a 2 ns delay compared to IN_DELAYED_0. IN_DELAYED_3 has a 3 ns delay compared to IN_DELAYED_0, etc. Thus, using the delay module 700, the pulse width of the generated clock signals (CLK) 602 (FIG. 6) may be varied in 1 ns increments. It may, however, be appreciated that any other incremental delay (e.g., 0.5 nm) may be introduced using the delay module 700. Moreover, in some implementations, the generated plurality of delayed input clock signals (IN_DELAYED_N) 702 may include various delays that are not necessarily incremental (e.g., IN_DELAYED_1=1 ns, IN_DELAYED_2=5 ns, IN_DELAYED_3=2 ns, etc.)

Figure 8:
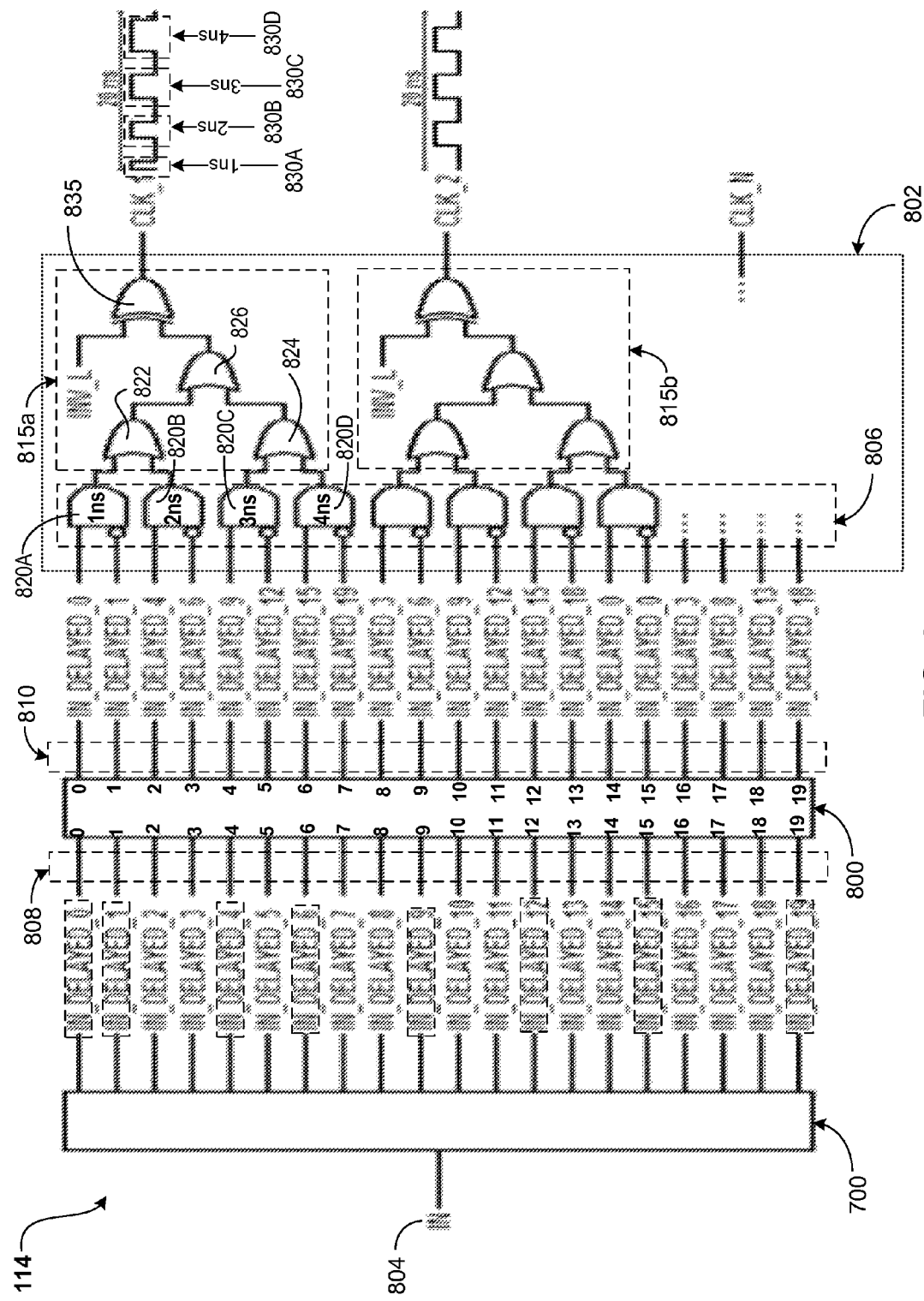
FIG. 8 depicts a block diagram of an exemplary embodiment of a timing unit located within the SER test environment of FIG. 1 according to one embodiment.

Thus, as disclosed herein, a complete bus of control signals utilizing only a single low-speed input clock may be generated using the embodiment of FIG. 8. FIG. 8 depicts a block diagram of the exemplary timing unit embodiment 114 (FIG. 1) generating the control bus signals on control bus 124 (FIG. 1).

Referring to FIG. 8, the exemplary timing unit 114 may include a delay module 700 (FIG. 7), a crossbar switch 800, and a combination logic control signal generation stage 802, which includes multiple clock pulse generators such as clock pulse generator 600 (FIG. 6). As indicated, the timing unit 114 may receive a single low speed input clock (IN) 804. The timing unit 114 may then generate a plurality of control bus 124 (FIG. 1) timing control signals (i.e., CLK_1, CLK_2, etc.) having controllable pulse widths from the received single input clock (IN) 804.

As previously described in relation to FIG. 7, the delay module 700 (FIG. 7) receives the input clock (IN) 804 and generates a plurality of time delayed clock signals (i.e., IN_DELAYED_0 . . . IN_DELAYED_19) each having, for example, a 1 ns incremental delay. The crossbar switch 800 may be configured to switch any one of its inputs 808 to any one of its outputs 810. Thus, as depicted, any one of the plurality of time delayed clock signals (i.e., IN_DELAYED_0 . . . IN_DELAYED_19) received at the inputs 808 of the crossbar switch 800 may be routed to one of the outputs 810. For example, input '0' is switch output '0', input '1' is switch output '1', input '4' is switch output '2', input '6' is switch output '3', input '9' is switch output '4', input '12' is switch output '5', input '15' is switch output '6', and input '19' is switch output '7'.

The combination logic control signal generation stage 802 includes a plurality of clock pulse generators 806 that are each identical to clock pulse generator 600 (FIG. 6). The combination logic control signal generation stage 802 may further include OR gate stages 815a, 815b for combining different pulses that are generated by the different clock pulse generators 806. For example, the CLK_1 control signal may be generated by combining the output of pulse generators 820A, 820B, 820C, and 820D using the OR gates 822-826 within gate stage 815a.

More specifically, pulse generator 820A generates a 1 ns pulse 830A based on receiving delayed clock signals IN_DELAYED_0 and IN_DELAYED_1, which are delayed with respect to each other by 1 ns. Pulse generator 820B generates a 2 ns pulse 830B based on receiving delayed clock signals IN_DELAYED_4 and IN_DELAYED_6, which are delayed with respect to each other by 2 ns. Also, this 2 ns pulse 830B starts 4 ns after the start of pulse 830A. This occurs based on the IN_DELAYED_4 signal starting 4 ns after the IN_DELAYED_0 signal, as depicted in FIG. 7. Pulse generator 820C generates a 3 ns pulse 830C based on receiving delayed clock signals IN_DELAYED_9 and IN_DELAYED_12, which are delayed with respect to each other by 3 ns. Also, the 3 ns pulse 830C starts 9 ns after the start of pulse 830A. This occurs based on the IN_DEL- AYED_9 signal starting 9 ns after the IN_DELAYED_0 signal, as depicted in FIG. 7. Also, pulse generator 820D generates a 4 ns pulse 830D based on receiving delayed clock signals IN_DELAYED_15 and IN_DELAYED_19, which are delayed with respect to each other by 3 ns. Also, the 4 ns pulse 830D starts 15 ns after the start of pulse 830A. This occurs based on the IN_DELAYED_15 signal starting 15 ns after the IN_DELAYED_0 signal, as depicted in FIG. 7.

OR gate 822 combines pulses 830A and 830B, while OR gate 824 combines pulses 830C and 830D. OR gate 826 then combines the resultant outputs from OR gates 822 and 824, which generates timing control signal CLK_1. Thus, timing control signal CLK_1 includes pulses 830A, 830B, 830C, and 830D, which are generated at the output of OR gate 826. EXOR gate 835 receives the output of OR gate 826 and an inverter control input (INV_L). When the inverter control input (INV_L) is at a logic '0', the output of the EXOR gate 835 is equivalent to the output of OR gate 826 (non-inverting mode). Alternatively, when the inverter control input (INV_L) is at a logic '1', the output of the EXOR gate 835 is equivalent to an inverted version of the output of OR gate 826 (inverting mode). As illustrated by the provided example, an input clock signal (IN) 804 having a 20 ns period (i.e., 50 MHz clock) is utilized to generate multiple pulses 830A-830D within the 20 ns period window of the input clock signal (IN) 804. The generated multiple pulses 830A-830D may then be applied to the control bus 124 (FIG. 1) for sending control signals (e.g., Read/Write etc.) to the DUT 108 (FIG. 1). Although, the exemplary embodiment depicts the CLK_1 signal having four (4) pulses generated within the 20 ns period window of the input clock signal (IN) 804, any number of pulses may be generated within this time window (e.g., 20 ns) using the various components 700, 800, 802 of the timing unit 114.

Figure 9:
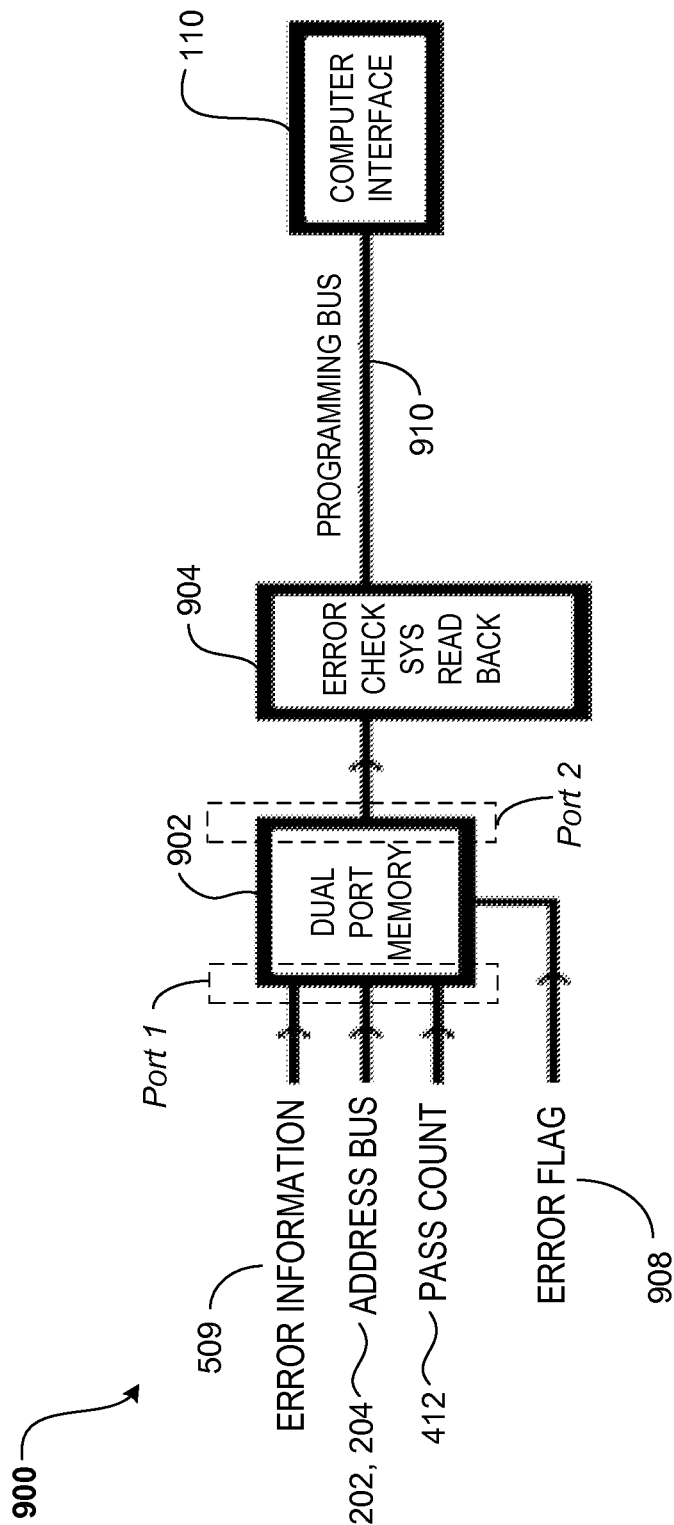
FIG. 9 depicts a block diagram of an exemplary embodiment of a MBU error detection unit located within the SER test environment of FIG. 1 according to one embodiment.

FIG. 9 depicts an exemplary embodiment of a MBU error detection unit 900. The MBU error detection unit 900 may be located within the error check system 112 (FIG. 1). However, in other implementations, the MBU error detection unit 900 may be a separate unit that is communicatively coupled to the error check system 112.

The MBU error detection unit 900 may include a dual port memory device 902 and an error check read back unit 904 that is in communication with computer interface 110 (FIG. 1). When an error is detected using the error detection with bypass circuits 500 (FIG. 5), the error check system 112 (FIG. 1) stores the error information 509 (also see FIG. 5: outputs 509 from error detection with bypass circuits 500), along with the values received from the address bus 202, 204 (also see FIG. 2: address buses 202, 204 coupled to word counter 216 and bit counter 218) and the pass count bus 412 (also see FIG. 4: pass count bus 412 coupled to pass counter 406), in the dual port memory device 902. The dual port memory device 902 stores this information based on receiving an error flag 908. The error flag 908 may be set based on any one of the outputs 509 from error detection with bypass circuits 500 (FIG. 5) generating a 'logic 1', which is indicative of the occurrence of at least one bit error. According to one exemplary embodiment, the error flag may be implemented by coupling the combined outputs 509 (FIG. 5) of the error detection with bypass circuits 500 (FIG. 5) to an OR logic device 515 (FIG. 5). Thus, anytime a single bit transitions to a logic 1, the OR device output 518 sets the error flag to a logic 1.

Upon the error flag 908 being set, the dual port memory device 902 stores the address location of the detected error on the DUT 108 (FIG. 1) via the word and bit address bus 202, 204. Also, once the error is detected, the pass count value on the pass count bus 412 is recorded by the dual port memory device 902. The pass count may act as a time stamp, which indicates when the error occurred. The error information may be stored by the dual port memory device 902 in order to analyze the logical-to-physical evaluation (i.e., mapping) of error locations associated with the test data written to the DUT 108 (FIG. 1).

The error check read back unit 904 may include a data buffer that is utilized by the computer interface 110 to read back the stored error data (e.g., error information, error address location, error pass count) from the dual port memory device 902. Thus, the stored error data (e.g., error information, error address location, error pass count) is retrieved by the computer interface 110 over programming bus 910.

The dual port feature of the memory device 902 may allow the computer interface 110 to read back the stored error data (e.g., error information, error address location, error pass count) through the programming bus 910 at PC speeds (e.g., lower data rates), while the tester 104 (FIG. 1) continues to evaluate and store new errors at generator speeds (e.g., higher data rates: 50 MHz). The tester's ability 104 (FIG. 1) to continue running tests during computer read back allows, among other things, for the detection of multiple sequential errors, adding to the accuracy and efficiency of the system. The additional storage of the pass count with each error, indicates the time that each error occurs, providing the necessary data for the measurement of MBU's. Logical-to-physical mapping of fail locations, along with temporal correlation, allows the separate specification of single-bit upsets (SBUs) and multi-bit upsets (MBUs). Without the dual port feature of the memory device, during the time which the PC is accessing the stored error data (e.g., error information, error address location, error pass count) for analysis, recently generated error data determined by the SER tester may not be recorded until the PC relinquishes its access to the memory device. Such gaps in SER error detection may subsequently cause failures in the determination of MBUs.

For example, the dual port memory device 902 may store five (5) detected errors having five (5) address locations. After a logical-to-physical mapping of the five (5) address locations it may be determined that all five (5) errors occurred directly next to each other (i.e., in sequence). A further evaluation of the errors may also reveal that the five (5) errors occurred during the same pass count value. Under such conditions it may be determined that a MBU has occurred. Alternatively, if after a logical-to-physical mapping of the five (5) address locations, it is determined that the five (5) errors occurred at different physical locations within the DUT and/or the five (5) error occurred during different pass count values, then a series of SBU events has occurred.

Figure 10:
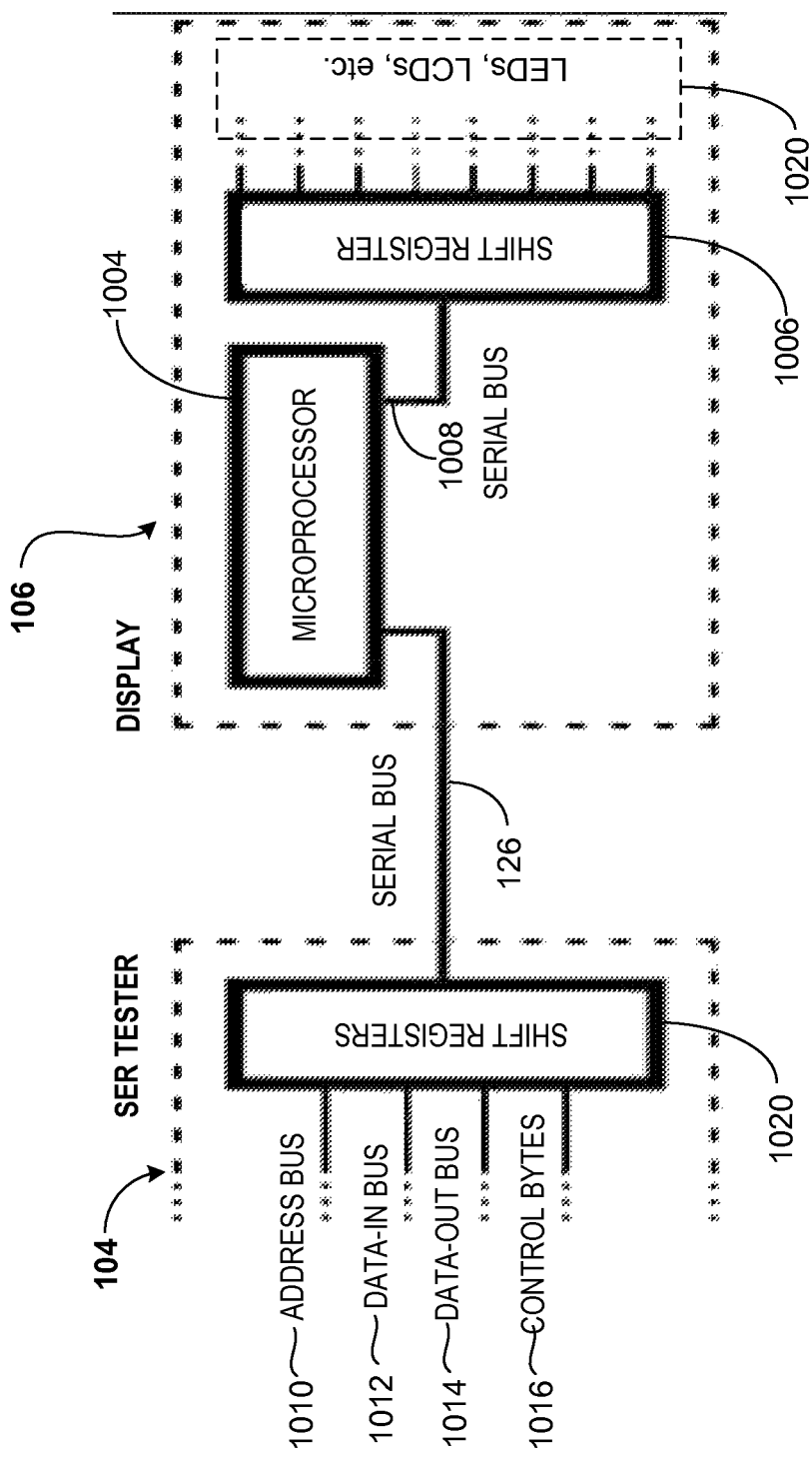
FIG. 10 depicts a block diagram of a display unit located within the SER test environment of FIG. 1 according to one embodiment.

FIG. 10 depicts a block diagram of an exemplary display unit 106 located within the SER test environment of FIG. 1 according to one embodiment. Due to the compact design of portable SER testers, a display unit such as display 106 may be stored away, and then setup for testing use.

As depicted in FIG. 10, the SER tester 104 may be coupled to the display unit 106 via serial bus 126. The display unit 106 may include a microprocessor 1004 and a shift register 1006 coupled together by a serial bus 1008. In order to minimize the number of cable lines between the SER tester 104 and the display 106, the SER tester 104 may stores all bus values 1010-1014 and a set of control bytes 1016 in shift registers 1020. The display 106, controlled by microprocessor 1004, may serially shift all bus values and control bytes 1010-1016 from the tester system 104 to the microprocessor 1004 across serial bus 126 (e.g., a 4-bit cable line). The control bytes 1016 may be interpreted by the microprocessor 1004 according to a table of pre-designated commands. This may provide a path for the programming bus 130 (FIG. 1) to modify the display 106 and read back any error messages, making it a smart display. The flexibility of the display 106 may then be determined by the complexity of the command table within the microprocessor 1004, which may be updated. According to the selected commands (i.e., accessed from the command table), the microprocessor 1004 may manipulate the data values' (e.g., from Data-in and/or Data-out buses 1012-1014) sequence and format, and serially shift them into another set of shift registers, whose outputs are displayed in LED's, LCD's, and other devices 1020. The microprocessor 1004 may performs a complete update of the display 106 in less than about 16 ms, providing a display refresh rate of over 60 Hz, the standard rate for HD.

Figure 11:
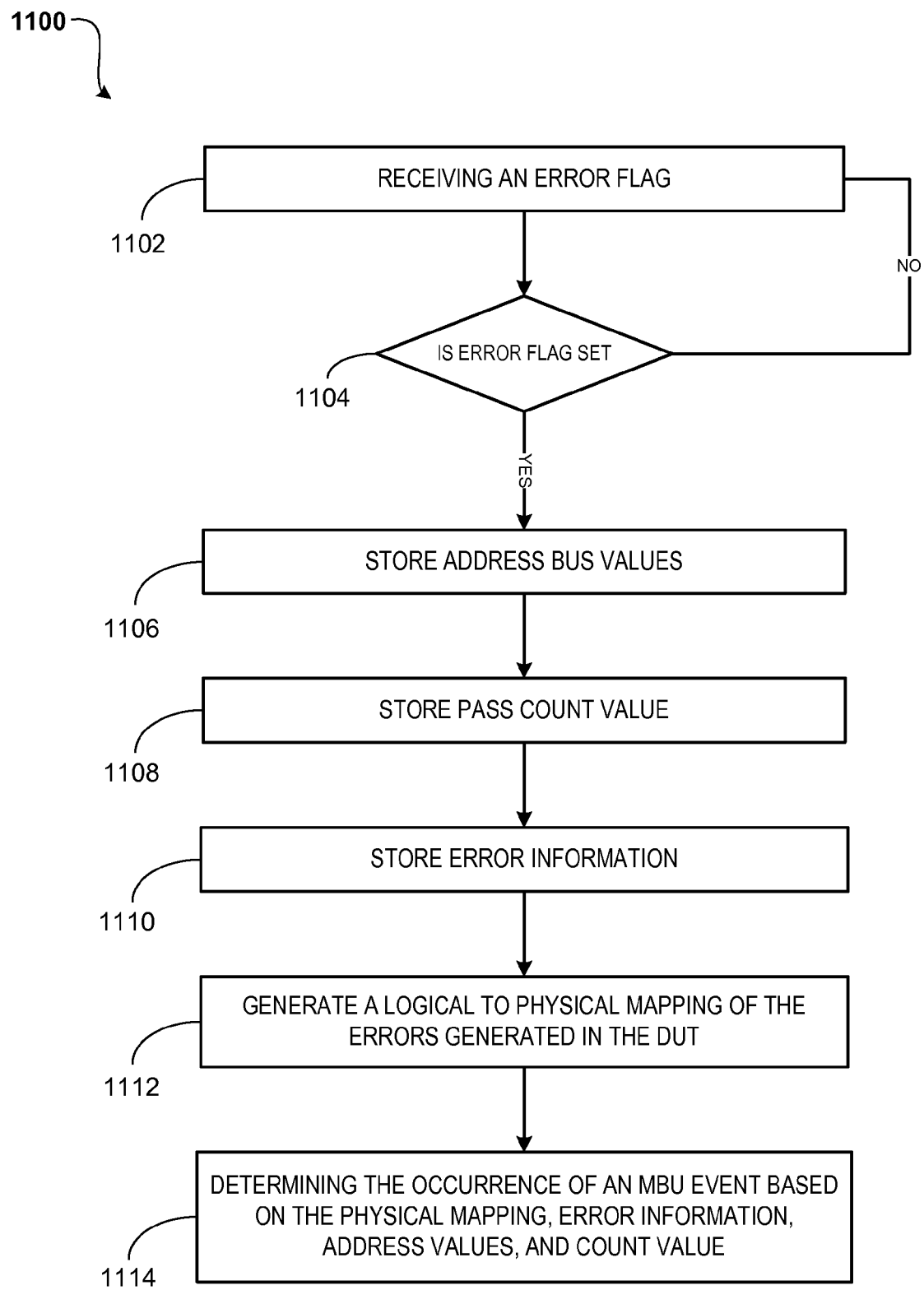
FIG. 11 depicts a process flow for a program associated with the operation of the MBU error detection unit located within the SER test environment of FIG. 1 according to one embodiment.

FIG. 11 depicts a process flow 1100 for a MBU determination program (MBU-DP) associated with the operation of the MBU error detection unit 900 (FIG. 9) located within error check system 112 (FIG. 1) of the SER tester 104 (FIG. 1), according to one embodiment. At 1102, the status of the error flag 908 (FIG. 9) generated by the error detection and bypass circuits 500 (FIG. 5) is monitored. If at 1104, the flag is not set to indicate the occurrence of an error (e.g., logic 0), the process returns to 1102, whereby the status of the error flag 908 (FIG. 9) generated by the error detection and bypass circuits 500 (FIG. 5) is continued to be monitored.

Alternatively, if the flag 908 (FIG. 9) is set to indicate the occurrence of an error (e.g., logic 1), at 1106 the address bus values from the address buses 202, 204 controlling the DUT 108 (FIG. 1) are stored by, for example, port 1 of the dual port memory device 902 (FIG. 9) in order to acquire the logical address location of the error within the DUT 108 (FIG. 1). Also, based on the determined error (1104), at 1108 the pass count value within the pass counter 406 (FIG. 4) that is received from the pass count bus 412 (FIG. 4) is also stored by, for example, port 1 of the dual port memory device 902 (FIG. 9) in order to acquire the time at which the error occurred (i.e., a time stamp or signature) during the SER test process.

At 1110, based on the determined error (1104), the error information 509 corresponding to the error output 509 of the error detection and bypass circuits 500 (FIG. 5) is also stored. The error information may provide a binary indication of the bit position of each error associated with the comparison between the stored data read from the DUT 108 (FIG. 1) via the Data-out bus 122 (FIG. 1) and the test pattern data written to the DUT 108 (FIG. 1) via the Data-in bus 122 (FIG. 1). At 1112, using the error information 509 and the address bus values from the address buses 202, 204, the logical addresses of the errors may be mapped to an actual physical location on the DUT 108 (FIG. 1).

At 1114, the actual physical locations of the errors on the DUT 108 (FIG. 1) and the pass count values may be utilized to identify the occurrence of an MBU. For example, as previously indicated, the dual port memory device 902 may store N detected errors having N address locations. After a logical-to-physical evaluation of the N address locations it may be determined that all N errors occurred directly next to each other (i.e., the physical error locations juxtaposed or in sequence). A further evaluation of the N errors may also reveal that the N errors occurred during the same pass count value $C_N$. Under such conditions it may be determined that a MBU has occurred. Alternatively, if after a logical-to-physical evaluation of the N address locations, it is determined that the N errors occurred at different physical locations within the DUT and/or the N errors each occurred during different pass count values (e.g., $C_{N-1}$, $C_{N-3}$, etc.), then a series of SBUs have occurred. Processes 1112 and 1114 may be carried out by accessing the stored error data (e.g., error information, error address location, error pass count) via, for example, port 2 of the dual port memory device 902 (FIG. 9).

Figure 12:
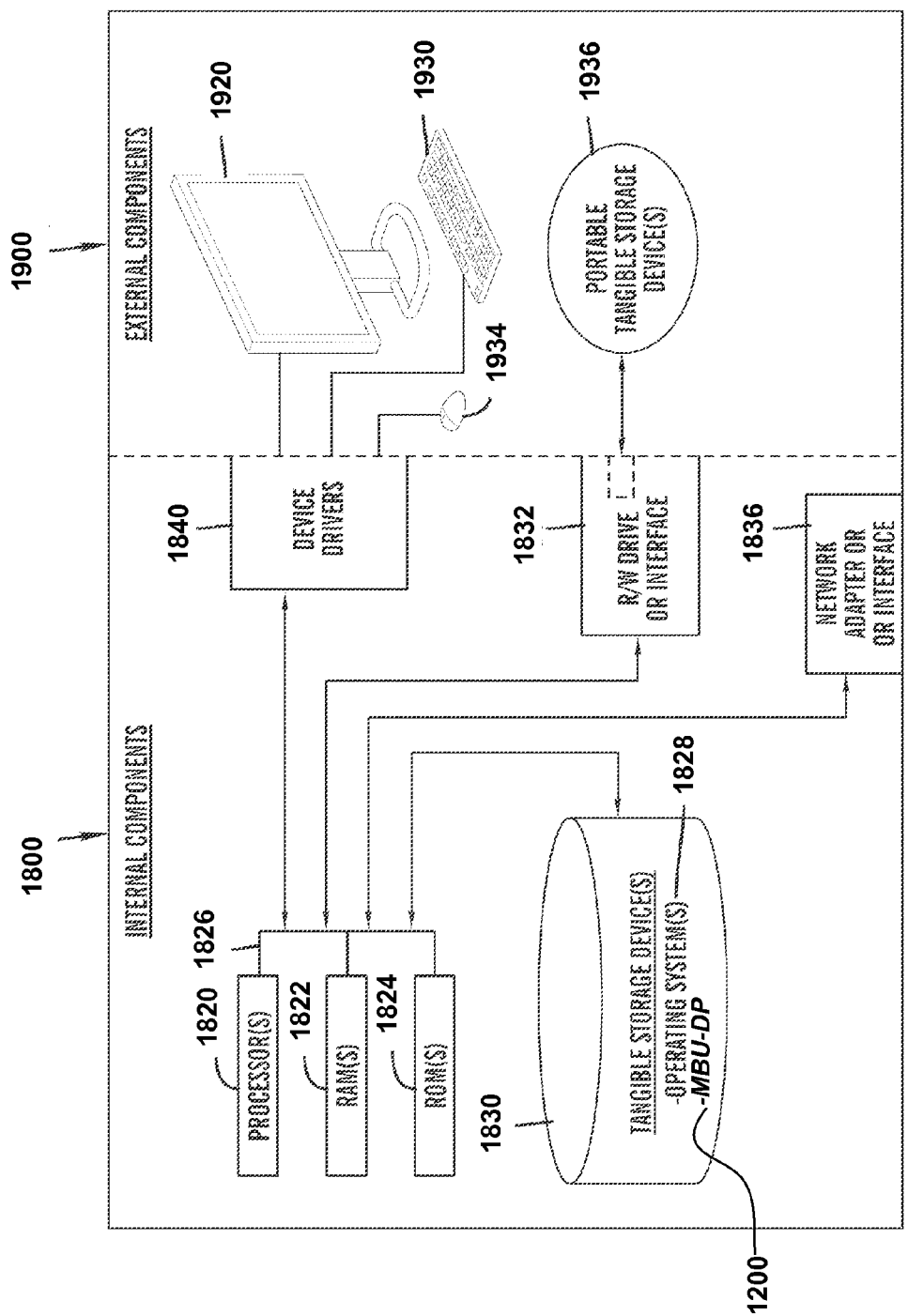
FIG. 12 is a block diagram of hardware and software for executing a process such the process flow of FIG. 11 according to one embodiment.

FIG. 12 shows a block diagram of the components of a data processing system 1800, 1900, implemented as, for example, the computer or processing device 102 of SER test environment 100 and/or one or more subsystems of SER tester 104 (FIG. 1) in accordance with an illustrative embodiment of the present invention. It should be appreciated that FIG. 12 provides only an illustration of one implementation and does not imply any limitations with regard to the environments in which different embodiments may be implemented. Many modifications to the depicted environments may be made based on design and implementation requirements.

Data processing system 1800, 1900 is representative of any electronic device capable of executing machine-readable program instructions. Data processing system 1800, 1900 may be representative of a smart phone, a computer system, PDA, or other electronic devices. Examples of computing systems, environments, and/or configurations that may represented by data processing system 1800, 1900 include, but are not limited to, personal computer systems, server computer systems, thin clients, thick clients, handheld or laptop devices, multiprocessor systems, microprocessor-based systems, network PCs, minicomputer systems, and distributed cloud computing environments that include any of the above systems or devices.

Within SER tester 104 (FIG. 1), error check system 112 (FIG. 1) may include MBU error detection unit 900 (FIG. 9). The MBU error detection unit 900 (FIG. 9) may include internal component 1800 and external component 1900 illustrated in FIG. 12. The internal component 1800 includes one or more processors 1820, one or more computer-readable RAMs 1822 and one or more computer-readable ROMs 1824 on one or more buses 1826, and one or more operating systems 1828 and one or more computer-readable tangible storage devices 1830. The one or more operating systems 1828 and programs such as the above-described (see FIG. 11: process 1100) MBU determination program (MBU-DP) 1200 are stored on one or more computer-readable tangible storage devices 1830 for execution by one or more processors 1820 via one or more RAMs 1822 (which typically include cache memory). In the embodiment illustrated in FIG. 12, each of the computer-readable tangible storage devices 1830 is a magnetic disk storage device of an internal hard drive. Alternatively, each of the computer-readable tangible storage devices 1830 is a semiconductor storage device such as ROM 1824, EPROM, flash memory or any other computer-readable tangible storage device that can store a computer program and digital information.

Internal component 1800 also includes a R/W drive or interface 1832 to read from and write to one or more portable computer-readable tangible storage devices 1936 such as a CD-ROM, DVD, memory stick, magnetic tape, magnetic disk, optical disk or semiconductor storage device. The MBU determination program (MBU-DP) 1200 can be stored on one or more of the respective portable computer-readable tangible storage devices 1936, read via the respective R/W drive or interface 1832 and loaded into the respective hard drive 1830.

Internal component 1800 may also include network adapters (or switch port cards) or interfaces 1836 such as a TCP/IP adapter cards, wireless wi-fi interface cards, or 3G or 4G wireless interface cards or other wired or wireless communication links. The MBU determination program (MBU-DP) 1200 can be downloaded from an external computer (e.g., server) via a network (for example, the Internet, a local area network or other, wide area network) and respective network adapters or interfaces 1836. From the network adapters (or switch port adaptors) or interfaces 1836, the MBU determination program (MBU-DP) 1200 is loaded into the respective hard drive 830. The network may comprise copper wires, optical fibers, wireless transmission, routers, firewalls, switches, gateway computers and/or edge servers.

External component 1900 can include a computer display monitor 1920, a keyboard 1930, and a computer mouse 1934. External component 1900 can also include touch screens, virtual keyboards, touch pads, pointing devices, and other human interface devices. Internal component 1800 also includes device drivers 1840 to interface to computer display monitor 1920, keyboard 1930 and computer mouse 1934. The device drivers 1840, R/W drive or interface 1832 and network adapter or interface 1836 comprise hardware and software (stored in storage device 1830 and/or ROM 1824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of determining a multi-bit upset (MBU) during soft error rate (SER) testing of a memory device under test, the method comprising:

receiving an error indication based on a comparison between a generated test data pattern written to an address location on the memory device and a stored version of the generated test data pattern read from the address location on the memory device, the error indication associated with error information corresponding to the comparison between the generated test data pattern and the stored version of the generated test data pattern;

determining by a processor, based on the received error indication, a count value associated with one of a predetermined number of passes that a plurality of generated test data patterns traverse between a first and a second memory address location on the memory device, wherein the determined count value identifies a timestamp;

determining the MBU based on the address location, the error information, and the determined count value, wherein the determining the MBU includes identifying that a threshold number of errors have occurred in sequence or at the same time based on the determined count value; and generating at least one timing control signal that includes a plurality of pulses each having a predetermined pulse width, wherein the at least one timing control signal determines the writing of the generated test data pattern to the address location on the memory device and the reading of the stored version of the generated test data pattern from the address location on the memory device, wherein the generating of the at least one timing control signal comprises:

receiving a clock signal;

generating a plurality of delayed signals by delaying the received clock signal;

selecting a first pair of delayed signals from among the plurality of delayed signals;

generating a first pulse signal having a first pulse period, wherein the first pulse period is determined based on a first delay value difference between the first pair of delayed signals;

selecting a second pair of delayed signals from among the plurality of delayed signals;

generating a second pulse signal having a second pulse period, wherein the second pulse period is determined based on a second delay value difference between the second pair of delayed signals; and combining the first pulse signal and the second pulse signal to form the at least one timing control signal, wherein the second pulse signal is delayed relative to the first pulse to form non-overlapping pulses.

2. The method of claim 1, wherein the determining of the MBU comprises accessing a dual port memory device.

3. The method of claim 1, further comprising storing the address location, wherein the storing of the address location comprises:

receiving a word address value from a word counter coupled to a word address bus; and receiving a bit address value from a bit counter coupled to a bit address bus.

4. The method of claim 1, further comprising storing of the error information associated with the comparison between the generated test data pattern and the stored version of the generated test data pattern, wherein the storing of the error information comprises storing the error information received from a plurality of comparator devices, each of the plurality of comparator devices applying an exclusive OR logic operation to each corresponding bit corresponding to the generated test data pattern and the stored version of the generated test data pattern.

5. The method of claim 1, wherein the determining the MBU based on the address location, the error information, and the determined count value comprises:

retrieving the address location, the error information, and the determined count value;

converting the retrieved address location and the retrieved error information from a logical memory address to a physical address location on the memory device;

retrieving other address locations and other error information associated with the other address locations;

converting the retrieved other address locations and the other retrieved stored error information from other logical memory addresses to other physical address locations on the memory device;

retrieving other count values corresponding to each of the other retrieved address locations and the other retrieved error information;

comparing the physical address location and the other physical address locations on the memory device to determine the physical error locations on the memory device; and determining the MBU when the physical error locations are juxtaposed and the count value and the other count values are identical.

6. The method of claim 1, wherein the address location, the error information, and the determined count value are stored using a first port of a dual port memory device.

7. The method of claim 6, wherein a retrieving of the stored address location, a retrieving of the stored error information, and a retrieving of the stored count value comprise retrieving the stored address location, the stored error information, and the stored count value using a second port of the dual port memory device.

8. The method of claim 7, wherein the second port of the dual port memory device is accessed by a computer for determining the MBU based on the retrieved address location, the retrieved error information, and the retrieved count value.

9. The method of claim 8, wherein the first port of the dual port memory device is accessed by an SER tester for, based on the received error indication, storing the address location, the accessed error information, and the accessed count value.

10. The method of claim 9, wherein the SER tester and the computer access the dual port memory device simultaneously, the SER tester accessing the first port of the dual port memory device at a first data rate and the computer accessing the second port of the dual port memory device at a second data rate, the first data rate being faster than the second data rate.

11. The method of claim 1, wherein the selecting the first pair of delayed signals comprises selecting a first and a second delayed signal from the plurality of delayed signals using a crossbar switch.

12. The method of claim 11, wherein the selecting the second pair of delayed signals comprises selecting a third and a fourth delayed signal from the plurality of delayed signals using the crossbar switch.

13. The method of claim 12, wherein the combining the first pulse signal and the second pulse signal comprises applying the first pulse signal and the second pulse signal to a logic OR gate.

14. The method of claim 13, wherein the generating the first pulse signal having a first pulse period comprises applying the first pair of delayed signals to a first logic AND gate having an inverted input and a non-inverted input, and wherein the generating the second pulse signal having a second pulse period comprises applying the second pair of delayed signals to a second logic AND gate having an inverted input and a non-inverted input.

15. A computer system for determining a multi-bit upset (MBU) during soft error rate (SER) testing of a memory device under test, the computer system comprising:

one or more processors, one or more non-transitory computer-readable storage mediums, and program instructions stored on at least one of the one or more non-transitory computer-readable storage mediums for execution by at least one of the one or more processors, wherein the computer system is capable of performing a method comprising:

receiving an error indication based on a comparison between a generated test data pattern written to an address location on the memory device and a stored version of the generated test data pattern read from the address location on the memory device, the error indication associated with error information corresponding to the comparison between the generated test data pattern and the stored version of the generated test data pattern;

determining, based on the received error indication, a count value associated with one of a predetermined number of passes that a plurality of generated test data patterns traverse between a first and a second memory address location on the memory device, wherein the determined count value identifies a timestamp;

determining the MBU based on the address location, the error information, and the determined count value, wherein the determining the MBU includes identifying that a threshold number of errors have occurred in sequence or at the same time based on the determined count value; and generating at least one timing control signal that includes a plurality of pulses each having a predetermined pulse width, wherein the at least one timing control signal determines the writing of the generated test data pattern to the address location on the memory device and the reading of the stored version of the generated test data pattern from the address location on the memory device, wherein the generating of the at least one timing control signal comprises:
- receiving a clock signal;
- generating a plurality of delayed signals by delaying the received clock signal;
- selecting a first pair of delayed signals from among the plurality of delayed signals;
- generating a first pulse signal having a first pulse period, wherein the first pulse period is determined based on a first delay value difference between the first pair of delayed signals;
- selecting a second pair of delayed signals from among the plurality of delayed signals;
- generating a second pulse signal having a second pulse period, wherein the second pulse period is determined based on a second delay value difference between the second pair of delayed signals; and
- combining the first pulse signal and the second pulse signal to form the at least one timing control signal, wherein the second pulse signal is delayed relative to the first pulse to form non-overlapping pulses.

16. The computer system of claim 15, wherein the determining of the MBU comprises accessing a dual port memory device.

17. A computer program product for determining a multi-bit upset (MBU) during soft error rate (SER) testing of a memory device under test, comprising:
one or more non-transitory computer-readable storage mediums and program instructions stored on at least one of the one or more non-transitory computer-readable storage mediums, the program instructions executable by a processor, the program instructions comprising:
receiving an error indication based on a comparison between a generated test data pattern written to an address location on the memory device and a stored version of the generated test data pattern read from the address location on the memory device, the error indication associated with error information corresponding to the comparison between the generated test data pattern and the stored version of the generated test data pattern;

determining, based on the received error indication, a count value associated with one of a predetermined number of passes that a plurality of generated test data patterns traverse between a first and a second memory address location on the memory device, wherein the determined count value identifies a timestamp;

determining the MBU based on the address location, the error information, and the determined count value, wherein the determining the MBU includes identifying that a threshold number of errors have occurred in sequence or at the same time based on the determined count value; and generating at least one timing control signal that includes a plurality of pulses each having a predetermined pulse width, wherein the at least one timing control signal determines the writing of the generated test data pattern to the address location on the memory device and the reading of the stored version of the generated test data pattern from the address location on the memory device, wherein the generating of the at least one timing control signal comprises:
- receiving a clock signal;
- generating a plurality of delayed signals by delaying the received clock signal;
- selecting a first pair of delayed signals from among the plurality of delayed signals;
- generating a first pulse signal having a first pulse period, wherein the first pulse period is determined based on a first delay value difference between the first pair of delayed signals;
- selecting a second pair of delayed signals from among the plurality of delayed signals;
- generating a second pulse signal having a second pulse period, wherein the second pulse period is determined based on a second delay value difference between the second pair of delayed signals; and
- combining the first pulse signal and the second pulse signal to form the at least one timing control signal, wherein the second pulse signal is delayed relative to the first pulse to form non-overlapping pulses.

18. The computer program product of claim 17, wherein the determining of the MBU comprises accessing a dual port memory device.

* * * * *